United States Patent
Capofreddi

(10) Patent No.: US 7,224,757 B2
(45) Date of Patent: May 29, 2007

(54) METHOD AND APPARATUS FOR IMPROVING THE PERFORMANCE OF DELTA-SIGMA MODULATORS

(75) Inventor: Peter D. Capofreddi, San Francisco, CA (US)

(73) Assignee: HRL Laboratories, LLC, Malibu, CA (US)

( * ) Notice: Subject to any disclaimer, the term of this patent is extended or adjusted under 35 U.S.C. 154(b) by 857 days.

(21) Appl. No.: 10/387,330

(22) Filed: Mar. 12, 2003

(65) Prior Publication Data

US 2003/0235256 A1 Dec. 25, 2003

Related U.S. Application Data

(60) Provisional application No. 60/364,387, filed on Mar. 13, 2002.

(51) Int. Cl.
*H04L 7/00* (2006.01)
*H03H 11/26* (2006.01)
*H04B 14/06* (2006.01)

(52) U.S. Cl. ............... 375/354; 375/247; 327/277

(58) Field of Classification Search ............ 375/244, 375/242, 247, 354, 395, 371; 327/261, 263, 327/277, 278; 341/77, 76, 143, 126; 332/101, 332/104; 708/307
See application file for complete search history.

(56) References Cited

U.S. PATENT DOCUMENTS 4,999,625 A * 3/1991 Thompson ............... 341/118
5,347,278 A * 9/1994 Callahan et al. ............ 341/143
5,392,039 A * 2/1995 Thurston ................ 341/143
6,448,915 B1 * 9/2002 Logue .................. 341/143
2002/0023999 A1 2/2002 Hsu et al. ............... 250/201.3

OTHER PUBLICATIONS

Woodward, C.E., et al., "A Monolithic Voltage-Comparator Array for A/D Converters," *IEEE Journal of Solid-State Circuits*, vol. SC-10, No. 6, pp. 392-399 (Dec. 1975).

(Continued)

*Primary Examiner*—Tesfaldet Bocure
*Assistant Examiner*—Vineeta Panwalkar
(74) *Attorney, Agent, or Firm*—Ladas Parry LLP

(57) ABSTRACT

A delta-sigma modulator that provides improved SNR performance in applications such as low-power mobile wireless communications and high frequency radar applications is disclosed. Multiple comparators 10, each comprising a sequence of three latches 20, 22, 24, connect the modulator's input filter circuit 12 to the modulator's output interfaces 14, providing quantization of the integrated, filtered signal provided by the filter circuit 12. A clock signal having a cycle period $T_c$ enables a first latch 20 connected to the signal input of each comparator 10 to provide a digital signal to the signal input of a second latch 22. The second latch 22 supplies a digital signal to a third latch 24 in the sequence, in response to the signal received from the first latch 20, by a lagged clock signal derived from the given clock signal $T_c$ by providing a first lag time $T_L$ where $T_c/2 \geq T_L > 0$. A third latch in the sequence is enabled by a clock signal having a second lag time $T_S = T_c/2 + T_E$, and the delay $T_E \ll T_c/2$. When $T_L = T_c/2$ the inverted clock signal supplied to the second latch is delayed and supplied to the third latch. When $T_L = T_E$ the delayed clock signal supplied to the second latch is inverted and supplied to the third latch.

29 Claims, 8 Drawing Sheets

OTHER PUBLICATIONS

Cherry, J.A., et al., "Clock Jitter and Quantizer Metastability in Continuous-Time Delta-Sigma Modulators," *IEEE Transactions on Circuits and Systems—II: Analog and Digital Signal Processing*, vol. 46, No. 6, pp. 661-676 (Jun. 1999).

Horstmann, J.U., et al., "Metastability Behavior of CMOS ASIC Flip-Flops in Theory and Test," *IEEE Journal of Solid-State Circuits*, vol. 24, No. 1, pp. 146-157 (Feb. 1989).

* cited by examiner

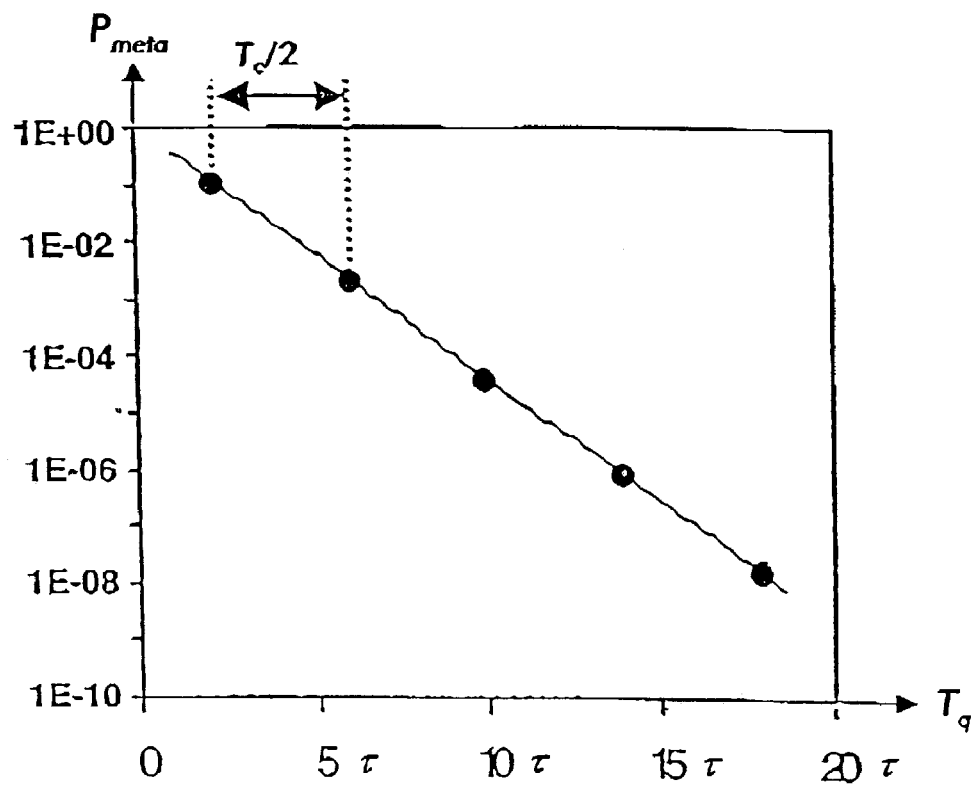
Fig. 4  PRIOR ART
Fig. 5c
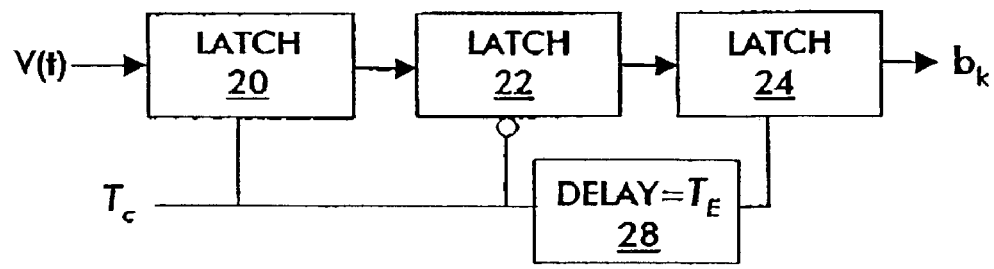

METHOD AND APPARATUS FOR IMPROVING THE PERFORMANCE OF DELTA-SIGMA MODULATORS

CROSS REFERENCE TO RELATED APPLICATIONS

This application claims the benefit of U.S. Provisional Patent Application Ser. No. 60/364,387 filed Mar. 13, 2002, the disclosure of which is hereby incorporated herein by reference.

STATEMENT OF GOVERNMENT INTEREST

This invention was related to work performed under the government contract entitled "CDRL A005 Low Power ADC Development Program". The government has certain rights in this invention.

BACKGROUND OF THE INVENTION

1. Field of the Invention

The present invention is related to analog to digital converter devices. More particularly, the present invention pertains to comparator devices used for digital signal generation.

2. Discussion of Related Art

The increasing importance of high-capacity wireless data communications has generated a demand for accurate, fast, and low-power-dissipation analog-to-digital converters to change high frequency analog inputs to digital signal formats. Delta-sigma modulators (DSMs) are often used to digitize signals having large dynamic range requirements, and have a wide variety of wireless applications, ranging from radar devices to low-power mobile communications. However, even though recent advances in very-large-scale circuit integration (VLSI) have provided low-cost, low-power implementations of the digital signal postprocessing associated with these DSMs, the comparator delay times and power parameters required for providing an adequate signal-to-noise ratio (SNR) for the DSMs has limited their usefulness.

A conventional delta-sigma modulator, shown in FIG. 1, uses one or more parallel comparator circuits 10 connecting a noise-shaping filter circuit 12, which provides the analog sum of an input signal stream $S_{in}$ and respective analog feedback signals $F_a$, to the interface circuits 14 that produce one or more one-bit, two-level digital feedback signals $F_b$. The feedback signals $F_1, \ldots F_n$, provided as digital signals $F_b$ by the interface circuits 14 in response to respective bit stream voltage signals $Vb_1, \ldots Vb_n$ output by the respective comparators 10, are converted to analog feedback signals $F_n$ by respective digital to analog converters (DACs) 16 and fed back on respective paths to respective input points in the filter circuit 12, as is well-known in the art. The output of the DSM provides multiple digital output signal streams $S_1, \ldots S_n$ in response to a sample clock signal having a given period $T_c$, and respective bit stream voltage signals $Vb_1, \ldots Vb_n$. Each DSM comparator 10 shown in FIG. 1 has a respective distinctive trip-point threshold $Th_1, \ldots Th_n$ set by a respective input resistance value $R_1 \ldots R_n$.

Conventional comparator circuits 10 used in DSMs consist of a sequence of two or three transparent latch stages enabled by alternate phases of the sample clock signal $T_c$, as shown in FIGS. 1a and 1b. In FIG. 1, each comparator produces an output voltage $V_b$ in each of the sampling intervals $t_i$ determined by the sample clock signal $T_c$, in response to the analog signal V(t) input by the filter circuit 12 to the comparator and the threshold Th of the individual comparator 10 determined by the respective resistance value $R_1, \ldots R_n$, so that each sample is quantized as one bit $Vb(t_i)$ in a digital bit stream $b_k$ for each of the intervals $kt_i$, as shown in FIG. 1c. Each bit $Vb(t_i)$ in the bit stream $b_k$ output by an ideal comparator is defined as:

$$b_k = \begin{cases} +1 \text{ if } V(t) \leq 0 \\ -1 \text{ if } V(t) > 0 \end{cases} \tag{1}$$

However the performance limitations of conventional comparator circuits result in deviations from this ideal behavior. In particular, quantization latency $T_q$ and the probability of a metastable state causing a comparator error $P_{meta}$ interact to limit the signal-to-noise SNR performance that can be achieved in DSM circuit designs having given frequency response and power efficiency parameters. The quantization latency $T_q$ is the time that elapses between the occurrence of a sampled value at a time $t_i$, and the occurrence of the smallest unambiguous comparator output voltage $V_L$ at the comparator output, which is shown schematically in FIG. 1c.

It can be considered a given that output error probability is $P=2V_L/AQ$, as explained by C. E. Woodward, et al. in *IEEE Journal of Solid State Circuits*, vol. SC-10 (December 1975) at p. 392. There, $V_L$ is the smallest unambiguous level for the comparator outputs $Vb_1$ thru $Vb_n$, Q is the least significant bit (LSB) voltage, e.g., the minimum value of the difference between the thresholds $(Th_{i+1}-Th_i)$ corresponding to the resistances $R_i, \ldots R_n$ shown in FIG. 1, and A is the gain of a comparator 10. Then, where t is the time after a latch command provided by the clock signal $T_c$ input to that comparator and τ is the regeneration time constant of the first latch stage 20 in that comparator:

$$A = \begin{cases} A_o, t < 0 \\ A_o e^{t/\tau}, t \geq 0 \end{cases}$$

Thus it can be demonstrated that, for input signal values V(t) that are uniformly distributed, the probability $P_{meta}$ is exponentially related to latency $T_q$:

$$P_{meta}=P_o \exp(-T_q/\tau) \tag{2}$$

It is important to note that the value of the regeneration time constant τ in equation #2 is independent of $P_{meta}$ and $T_q$, and varies with the parasitic capacitances associated with the transistors in the first stage in a manner well-known in the art. Therefore $P_{meta}$ is an inverse function of $T_q$, when both are expressed as a multiples of τ, as is discussed in greater detail with reference to FIG. 5 below. Thus, in general, $P_{meta}$ increases as $T_q$ decreases, and decreases as $T_q$ increases, as shown in FIG. 3a, thereby providing a trade-off that sacrifices either frequency response or SNR, as indicated by FIG. 3b.

This quantization latency $T_q$ in a comparator's bit stream $(b_k)$ can be reduced, for low-frequency signals, without increasing $P_{meta}$ by adjusting the coupling of the respective feedback signal $F_a$ into the filter circuit 12 from the interface circuits 14 in a manner well-known in the art. However, given that $f_c=1/T_c$, at higher signal frequencies where $T_q>T_c/2$ that conventional compensation method is ineffective. The maximum usable signal frequency $f_{max}$ provided by the conventional method is approximately:

$$f_{max} \approx \frac{1}{4T_q} \qquad (3)$$

Metastability errors are produced by the comparator's inability to promptly make a conclusive bit decision when the comparator's input sample V(t) is in a gray area $V_g$ defined as $V_g=2V_L/A_o$, where $V_L$ is the smallest unambiguous comparator output and $A_o$ is the DC gain of the comparator. In this gray area $V_g$ there is some small but significant probability that the output of the comparator will remain at an indeterminate level between the 0 and 1 digital states after the expected transition time Tr, as shown in FIG. 2b. Thus the metastability $P_{meta}$ of each comparator's digital output Vb is a function of what voltage V(t) is provided by the filtered analog signal input to that comparator input in each sampling interval $t_i$.

Metastability is a critically important factor in the design of synchronizer circuits, where it compromises the reliability of the output signals' synchronization. In synchronizer circuit design, metastability has been measured as the number of indeterminate states occurring when a predetermined lag time is provided between the nominal clock pulse of the output of a synchronizer flipflop connected to the input of a second flipflop driven by a sample clock signal $T_c$. See J. U. Horstmann, et al., "Metastability Behavior of CMOS ASIC Flip-Flops in Theory and Test", *IEEE Journal of Solid State Circuits*, vol. 24, no. 1 (February 1989), pp. 146–157. Ideally, of course, no errors would occur in the output that these synchronizers produce after the expected transition time Tr. Thus, in practice, metastability errors in these synchronizers can be reduced at the expense of an increase in quantization latency $T_q$ from a point between $t_i$ and Tr to a later point, even beyond Tr in FIG. 2b. However, this reduces the suitability of these synchronizers for use in high-frequency applications, applications that implementing frequencies above the conventional $f_{max}$ values provided by these circuits. This theoretical trade-off between latency and metastability is illustrated graphically in FIG. 3a.

After all possible error corrections have been made, the SNR achievable by a DSM is a function of the probability of metastability error events $P_{meta}$, as shown in FIG. 3b. Because all metastability errors are probabilistic rather than deterministic events, these errors cannot be effectively corrected or compensated, they must be prevented. See, J. A. Cherry et al., "Clock Jitter and Quantizer Metastability in Continuous-Time Delta-Sigma Modulators," *IEEE Transactions on Circuits and Systems*, vol. 46 no. 6 (June 1999), pp. 661–676. However, to use DSMs in many popular applications, the DSMs' conventional $T_q$ values must be reduced, not increased, so that $f_{max}$ can be increased.

In FIG. 3b, the position of this SNR/$P_{meta}$ trade-off curve is independent of the interval $T_c$ provided by the comparators' sample clock frequency $f_c$. Instead, it is a function of the design parameters of the DSM circuit, particularly the permissible rate of power consumption, and the integrated circuit technology used to implement the modulator. Specifically, $T_q$ and $P_{meta}$ in conventional comparator circuit designs are both a function of the number of latch stages (n) used in the comparator circuit, and can be expressed as:

$$T_q = a + T_c(n-2)/2 \qquad (4)$$

and $$P_{meta} = b\ \exp(-c[a+T_c(n-2)/2]) \qquad (5)$$

where the coefficients "a, b, c" are design-specific constants such that, where n is the number of latches and $n \geq 2$ they are: $a=T_q$ for n=2, $b=P_o$, $c=1/\tau$. These constants are independent of the parameters affected by the present invention, and "exp" indicates that the subsequent parenthetical expression is an exponential function.

However, only a small subset of the points along the tradeoff curve shown in FIG. 3a are implemented by practice of adding latch stages to conventional comparator circuits, points that correspond to the cumulative delays produced by half-integer multiples of $T_c$, as shown in FIG. 4. The first two points correspond to the performance provided by two and three-stage implementations found in the prior art. The subsequent points in FIG. 4 correspond to additional latch stages proposed by J. A. Cherry, et al., (supra).

Continuous-time delta-sigma modulators (CT-DSMs), in particular, are advantageous for radar and popular low-power, high frequency digital mobile telecommunications applications because they can potentially provide higher resolution at a lower power consumption rate than discrete-time modulators. Unfortunately, the continuous-time DACs used in CT-DSMs increase the CT-DSMs' sensitivity to the metastability errors occurring during quantization. However, the additional stages proposed by J. A. Cherry, et al. to reduce metastability in continuous-time modulators significantly increase the modulators' power consumption. Thus, at least in theory, both the operating frequency and the power efficiency advantages of CT-DSMs are limited by the need to reduce the occurrence of metastability errors in CT-DSMs.

In low-pass DSM devices where $f_{min}=0$, the comparator latency $T_q$ required to achieve an acceptable metastability error rate is a small fraction of the period of the highest signal frequency input to the modulator, reducing the probability $P_{meta}$ of sample values in grey area $V_g$. However, in band-pass modulators, where $f_{max} \approx f_{min}$, the latency $T_q$ may occupy a large portion of the period $T_c$ available at center frequency ($f_{ctr}$) of the bandpass signal. As the latency approaches one-half of the period of output signal's frequency $T_c/2$, it becomes difficult to achieve stability in the feedback loop in these DSM devices.

The conventional trade-offs that increase quantization latency and the number of latch stages to reduce the incidence of these non-correctable probabilistic metastability errors in CT-DSMs reduce their operating frequency and, elevate the power consumption rate, respectively. Since many popular CT-DSM applications, such as the low-power, high-frequency GSM and PCS digital mobile telecommunications devices, require both increased high frequency capability and minimal power consumption, some other means of reducing metastability errors is needed.

SUMMARY OF THE INVENTION

In accordance with the present invention the performance of a DSM is improved by an invention reducing the metastability errors produced by a comparator, wherein a second latch in the comparator is enabled with a delayed clock signal that has a lag $T_L$ relative to a clock signal that enables a first latch in the comparator to produce a first latch signal, such that $T_L \neq nT_c/2$ and $T_L \neq 0$. The second latch is connected to the first latch and adapted to be enabled by the delayed clock signal to produce a second latch signal in response to a latch input signal produced in response to said first latch signal.

In one particular embodiment $T_L=T_E$, $T_c/2>T_E>0$, where a third latch subsequent to the second latch is enabled by the logical complement of the delayed clock signal having a lag time $T_s$ relative to the clock signal that enables the first latch such that $T_c > T_s > T_c/2$.

Preferably the delayed clock signal is provided by adding a delay time $T_E$ to the clock signal that enables the first latch.

In another particular embodiment $T_L = T_E + T_c/2$, where $T_c/2 > T_E > 0$ and a third latch subsequent to the first latch is enabled by the logical complement of the clock signal having a lag time of $T_c/2$ relative to the clock signal that enables the first latch.

Preferably the delayed clock signal is provided by adding a delay time $T_E$ to the logical complement of the clock signal that enables the first latch.

In one particular embodiment the clock signal having a lag time of $T_c/2$ relative to the clock signal that enables the first latch is provided by inverting that clock signal.

In a modulator circuit in accordance with the present invention a comparator connects the output of the filter circuit to the input of the modulator's output interface circuit. The comparator includes a first latch connecting the output of the filter circuit to a second latch. The first latch is enabled to produce a first latch signal in response to a signal on the output of the filter circuit by a given clock signal having a given phase and a given cycle period $T_c$. The second latch is enabled by a delayed clock signal having a lag time $T_E$ such that $T_c/2 > T_E > 0$ to produce a second latch signal in response to said first latch signal.

Quantization in accordance with the present invention supplies an analog signal to a first latch that is enabled by a clock signal having a clock period $T_c$ to produce a first latch signal in response to said analog signal. A second latch is enabled by a delayed clock signal offset by a lag time $T_E$ relative to the start of each clock period such that $T_c/2 > T_E > 0$ to produce a second latch signal in response to said first latch signal. In a particular embodiment, a third latch is enabled by a phase of said delayed clock signal opposite to a given phase that enables the second latch, to produce a third latch signal in response to said second latch signal.

BRIEF DESCRIPTION OF THE DRAWINGS

The features and advantages of the present invention will be better understood and appreciated when the detailed description provided below is considered in conjunction with the figures provided, wherein:

FIG. 4 illustrates the metastability tradeoffs available in accordance with the prior art;

FIGS. 5b and 5c are one-line block diagrams of respective embodiments of a comparator in accordance with the present invention for use in the DSM modulator shown in FIG. 1;

DETAILED DESCRIPTION OF THE PREFERRED EMBODIMENTS

Figure 5A:
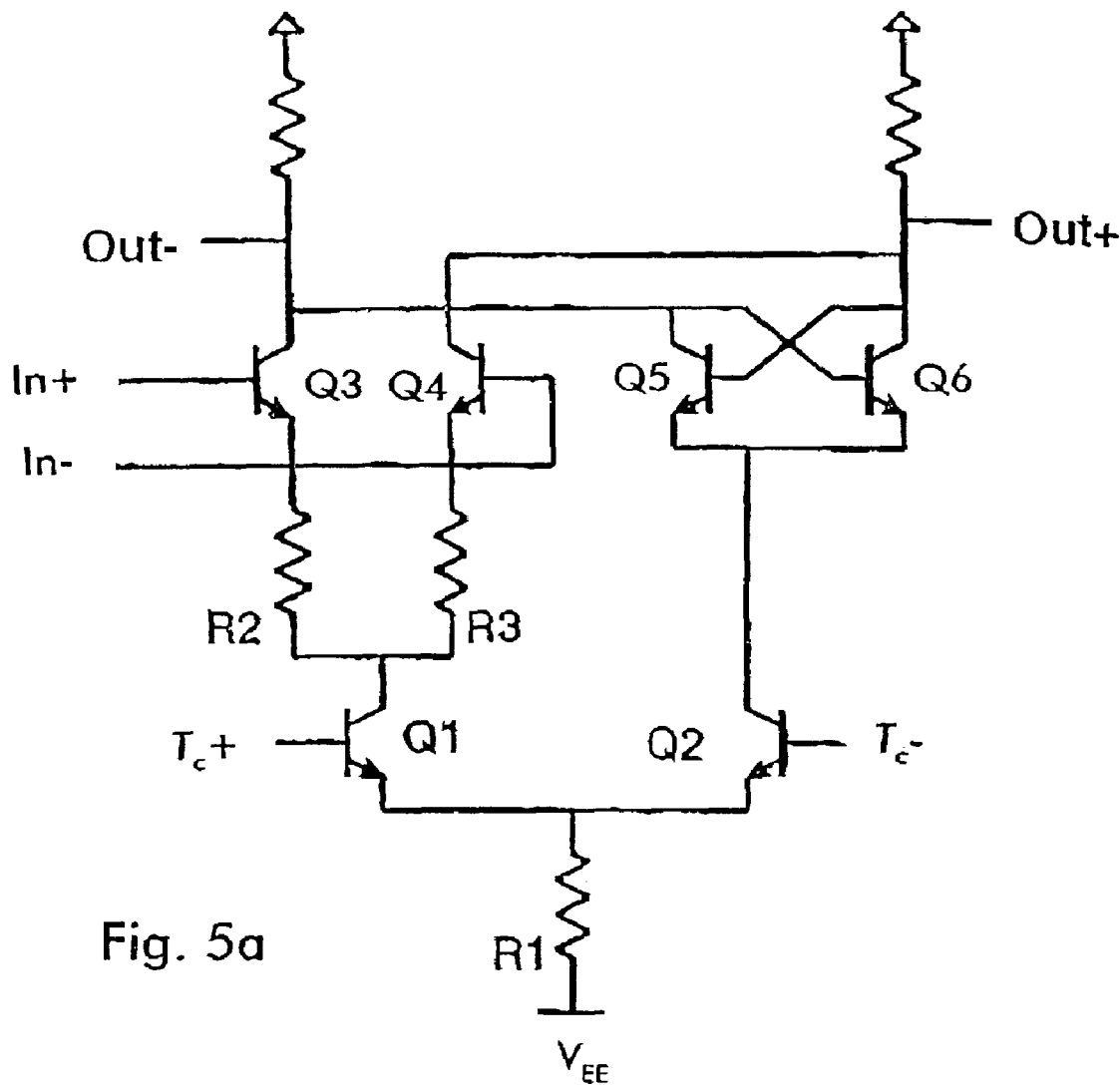
FIG. 5a is a two-line schematic circuit diagram of a D-type differential latch circuit used in DSM comparators.
Figure 5B:
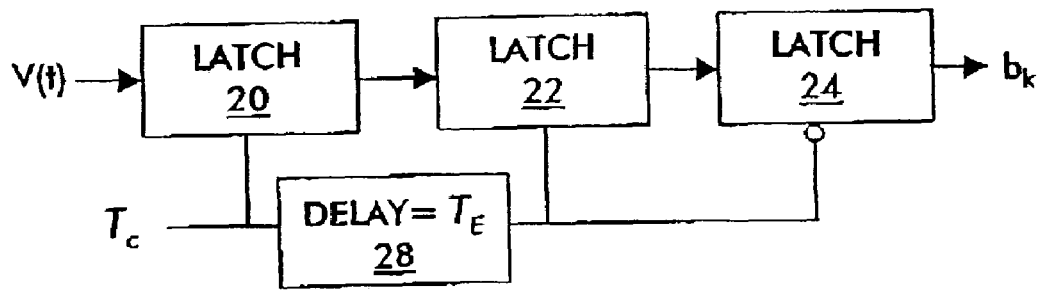

Each of the comparators 10 used in delta-sigma modulators (DSMs) is made up of at least three latch stages as shown in FIGS. 5b and 5c. Each latch stage is preferably a D-type transparent latch the same or similar to the bipolar latch circuit shown in FIG. 5a. The input to the first latch stage 20 in each comparator 10 is effectively analog, in contrast to the digital outputs provided to each subsequent latch stage in the comparator 10. Also, the first stage 20 of each comparator 10 in the DSM has a respective distinctive trip point, so that each comparator produces a respective distinctive stream of bits ($b_k$) as its output ($V_b$).

The first latch stage 20 in each comparator circuit 10 samples the input signal at the falling edge of the clock signal and regenerates the input signal to a valid logic level. The last stage 24 in each comparator 10 provides a current source that permits the comparator's output $S_1$–$S_n$ to slew between the given voltage levels that define logic levels 1 and 0 at a high rate, while driving the interface circuit 14, which includes six D/A converter cells and an output encoder cell in a presently preferred embodiment.

Figure 5D:
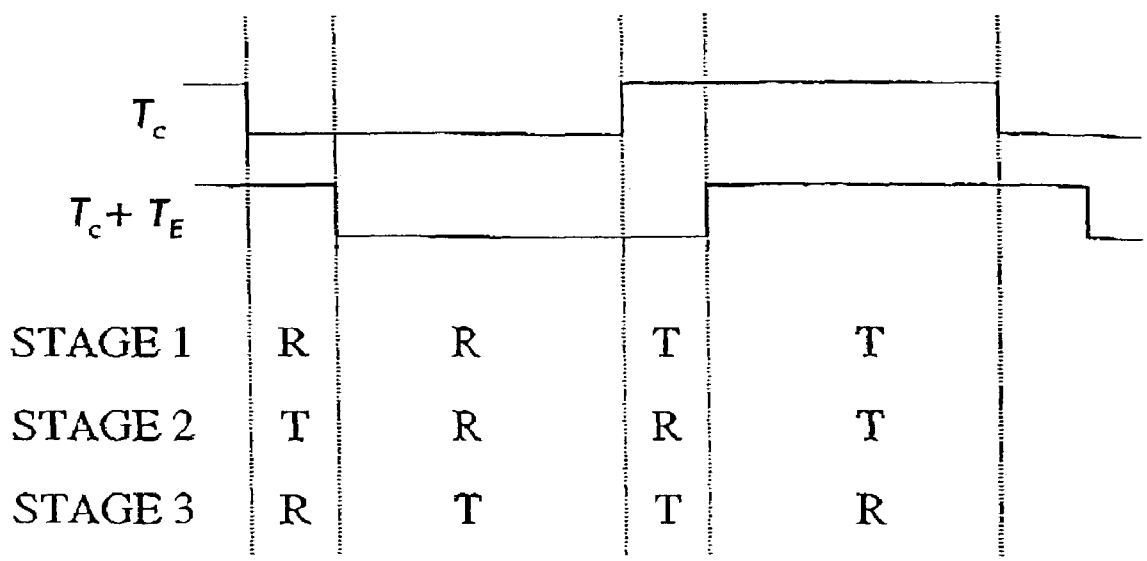
FIGS. 5d and 5e are timing diagrams for comparators in accordance with the embodiments of the present invention shown in FIGS. 5b and 5c, respectively.

As shown in the two-line schematic in FIG. 5a, each latch stage 20, 22, 24 in each comparator circuit 10 in the DSM is controlled by a differential transistor pair Q1 and Q2. Q1 and Q2 steer a tail current provided through R1 to one of two amplifier circuit paths in the latch 20, depending on the phase of the clock signal $T_c$, shown as a single line in FIGS. 5b and 5c and here represented by the clock signal provided to the $T_c+$ input and the complementary signal provided to the $T_c-$ input. In the high phase of the clock signal $T_c$, the latch stage 20, 22, 24 is in a transparent state. In the transparent state (T) the differential transistor pair Q3 and Q4 in the first path of the latch 20 supply amplified signals representing the input signals applied to complementary inputs In+ and In− to the complementary outputs Out+ and Out−. In the low phase of the clock signal $T_c$, the tail current is steered into a cross-coupled differential pair Q5 and Q6 in the second path. Positive feedback provided by this cross-coupled pair regenerates the signal already present at the latch outputs Out+ and Out−. That is, in the regeneration state (R), the differential voltage between the collectors of Q5 and Q6 continuously increases during this "regeneration time" such that:

$$\frac{dV_{out}(t)}{dt} = \frac{V_{out}(t)}{\tau} \quad (6)$$

until the voltages on the outputs Out+ and Out− both reach one of the two predetermined "0" and "1" voltage output logic levels. FIG. 5d is a timing diagrams for comparator in accordance with the embodiment of FIG. 5b showing the state each stage is in during the clock signal $T_C$ and the delayed claock signal $T_C+T_E$.

Each latch's regeneration time constant τ depends upon the gain of the transistors Q5 and Q6. However, the gain of transistors Q5 and Q6 varies during each latch cycle as a function of the value of the latch's output voltage $V_{out}$. Nonetheless, τ does remain approximately constant during the initial part of each latch cycle when the latch's output voltage $V_{out}$ has a small value relative to the latch's thermal voltage $kT/q$ ($V_{out}$<<kT/q), where k is Boltzman's constant, T is absolute temperature, and q is the electron charge. This small-signal transistor model provides an approximate value for τ, using the tail current ($I_l$) and the load capacitance $C_L$ on the complementary outputs Out+ and Out− including the collector-base capacitances of Q3–Q6:

$$\tau = \frac{4kTC_L}{qI_l}$$

so that:

$$V_{out}(t) = V_{out}(0) \exp(t/\tau). \quad (7)$$

Figure 3A:
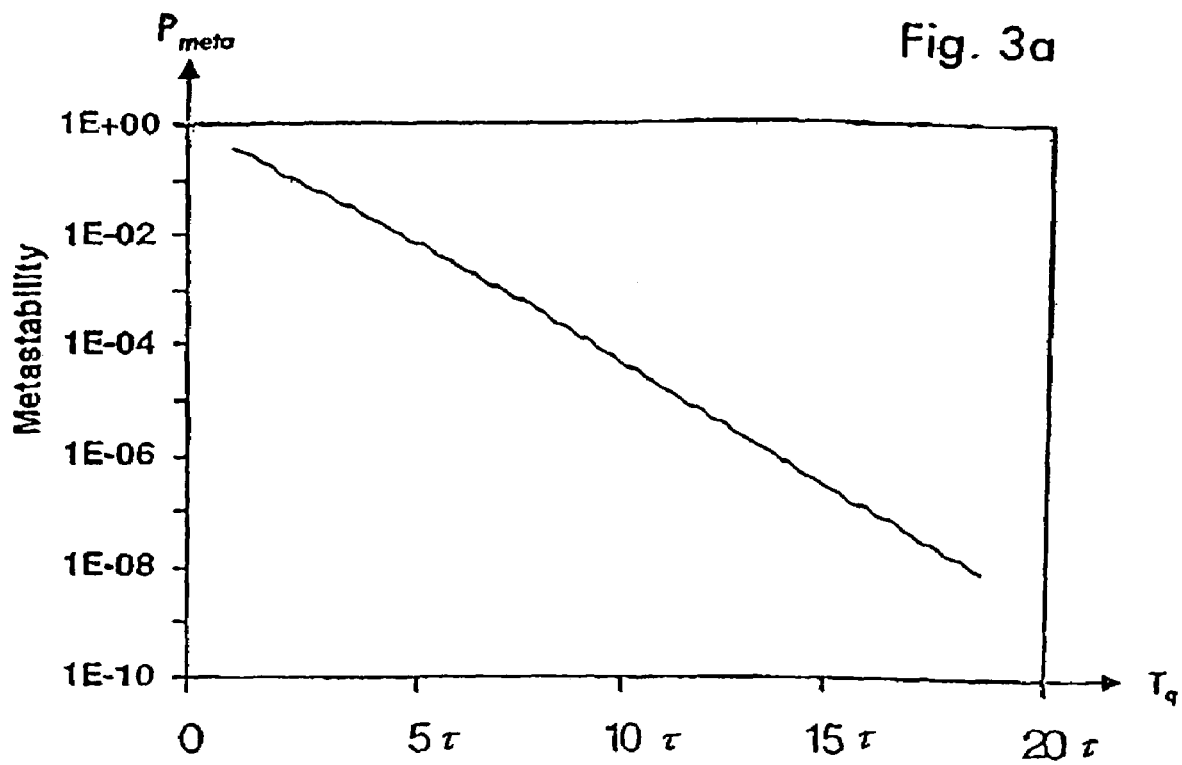
FIG. 3a illustrates the relationship between a comparator's probability of metastability errors and a conventional prior art comparator's quantization latency.
Figure 3B:
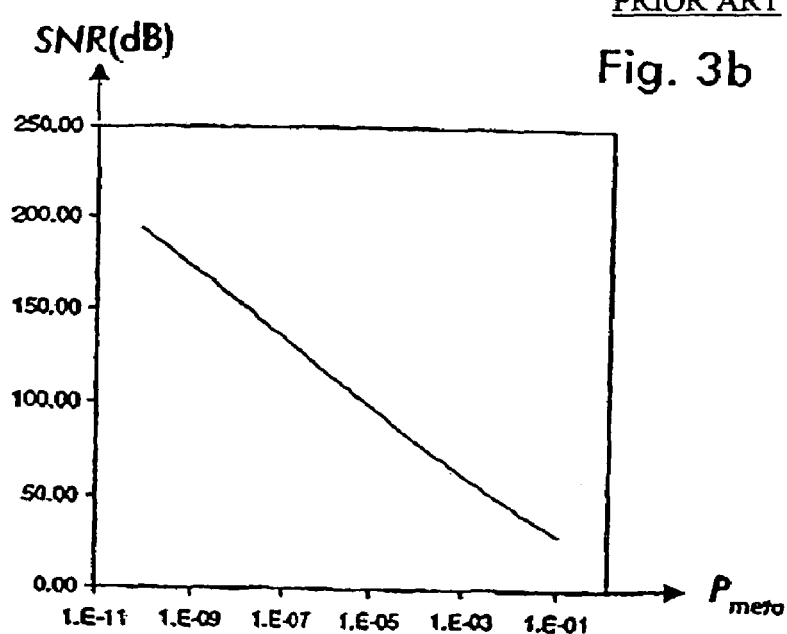
FIG. 3b illustrates the relationship between the probability of metastability errors and the signal-to-noise ratio of the signal output by a conventional prior art comparator.

Thus, although by the end of the regeneration phase τ is actually no longer a constant value, the exponential regeneration model using the small-signal assumption $V_{out}(t)$<<kT/q provides a constant value for τ that can be used to represent the latch's metastability performance, even so. Consequently, in FIGS. 3a, 3b and 4, the relationships between $P_{meta}$, $T_q$ and the SNR performance of a CT-DSM can be conveniently quantified by using multiples of this regeneration time constant τ as the measure of metastability.

In FIG. 5b, the comparator 10 preferably comprises a series of three of the D-type latch circuits shown in FIG. 5a and an unclocked buffer amplifier on the comparator's output (not shown) that assures an adequate output slew rate to prevent distortion. The second latch 22 of the comparator 10 is enabled by a delayed clock signal having a lag time $T_L$. The delayed clock signal is produced by supplying the clock signal that enabled the first latch stage 20 to the second latch stage 22 through a delay device 28 that adds a delay $T_E$, such that lag time $T_L=T_E$ and $T_C/2 > T_E > 0$.

$T_E$ is selected so that the level of the signal output by the first latch 20 has enough time to regenerate out of the grey area before it is sampled by the second latch 22. In this way, the second latch 22 censors the output of the first latch 20, so that while the output of the first latch 20 is in an indeterminate transparent state, the signal output by the first latch 20 is not "seen" by the second latch 22. In practice, adequate delay $T_E$ is added to bring the SNR of the comparator to an acceptable level and, typically, $T_C/2 >> T_E$.

The third latch stage 24, in FIG. 5b, is enabled by the logical complement of the delayed clock signal that enabled the second latch stage 22 by simply swapping the respective delayed clock signals $T_c+$ and $T_c-$ provided to the inputs of second stage 22 when that delayed clock signal is supplied to the third stage 24. Thus the lag time of this inverted delayed clock signal $T_s$ relative to the clock signal enabling the first latch stage 20 is the sum $T_s=T_L+T_c/2$ where $T_L=T_E$.

FIG. 5c shows a comparator 10 for use in a CT-DSM in accordance with another preferred embodiment of the present invention. In this embodiment, the third latch 24 serves as an output buffer stage. All three latch stages 20, 22, 24, are preferably D-type latch circuits, preferably as shown in FIG. 5a. The second latch 22 is enabled by the logical complement of the clock signal that enables the first latch stage 20 by swapping the signals provided to the $T_c+$ and $T_c-$ inputs of the second stage 22. Thus the second latch stage 22 is enabled by a clock signal having a lag time $T_L$ relative to the said given clock signal such that $T_L=T_c/2$.

In FIG. 5c, the sample $V(t_i)$ of the analog input signal $V(t)$ from the filter circuit 12 produced by the first latch stage 20 provides a leading edge for the comparator's output signal $S_n$. Because an inverted clock signal is supplied to the second stage 22, second stage 22 holds the leading edge value produced by the first latch stage 20 constant while the first latch stage 20 is in the transparent phase of its next latch cycle, i.e., while it is no longer producing a valid logic level. Of course, the first stage 20 then produces a valid logic level while the second stage 22 is in its transparent phase. Thus the regeneration phase of this second latch stage 22 holds the bit ($b_k$) output by the comparator at a valid logic level while the first latch stage 20 is in a transparent phase and is not necessarily providing a valid logic level.

In FIG. 5c, the third latch stage 24, however, is enabled by the same clock that enabled the second latch stage 22, with an additional delay $T_E$ provided by a delay device 28 such that $T_c/2 > T_E > 0$. This second lag time $T_S = T_c/2 + T_E$ is such that the third latch stage 24 enters its transparent phase only after the first latch stage 20 is already in its regeneration phase, and enters its regeneration phase while the second stage 22 is still in its regeneration phase. This lagged action of the third latch 24, the output buffer stage, censors any tendency of the comparator output to deviate from valid logic states during phase transitions in the first two latch stages 20 and 22. This eliminates the occurrence of "grey-area" low-voltage signals, that are not valid logic levels, in the early portion of each latch cycle for all but the first latch stage 20. Eliminating the occurrence of "grey area" input voltages at the inputs of these two latch stages, in this way, prevents the occurrence of metastable states at their outputs. However, in a small number of instances where the input signal V(t) is very small, the second latch stage 22 may be transparent and the output of the first latch stage 20 will not have finished regenerating when the third latch stage 24 becomes transparent, which may produce a metastable state in the bit stream ($b_k$) output by the comparator that is the signal $S_n$ input to the output interface 14.

Figure 5E:
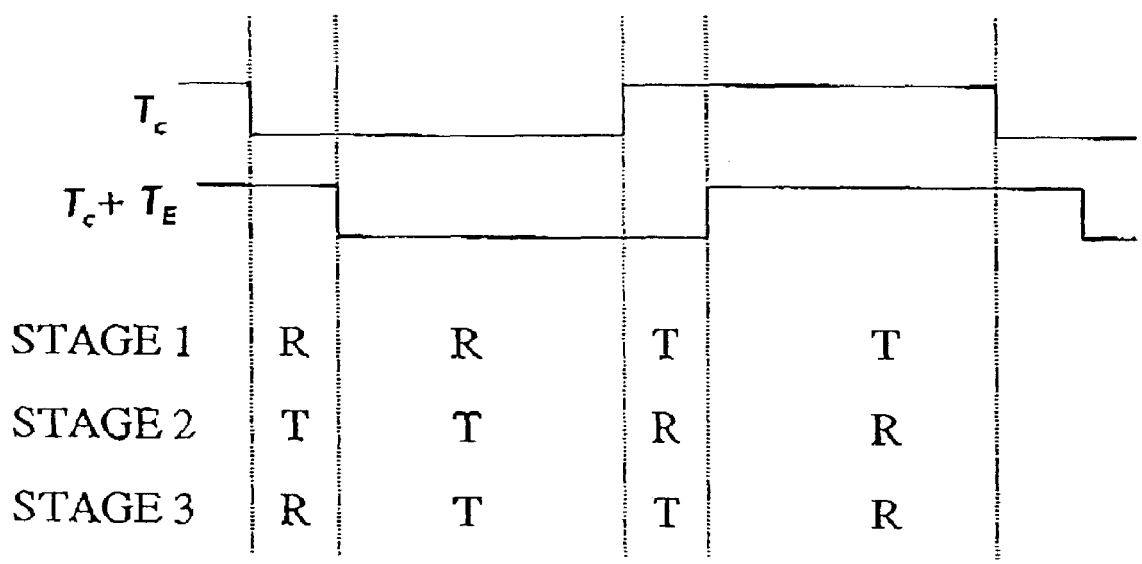

FIG. 5e is a timing diagram for comparator in accordance with the embodiment of FIG. 5c showing the state each stage 20, 22, 24 is in during the clock signal $T_C$ and the delayed clock signal $T_C+T_E$.

In both embodiments, because the metastability performance of the comparator shown therein depends primarily on the regeneration time required by the first latch stage 20, the designer can apply all available resources to the task of optimizing that one stage. For example, modified circuit topologies can be used to reduce parasitic capacitances that affect the regenerating nodes, and more supply current may be allocated to this one latch stage in each comparator, as is well known in the art.

The purpose of the second latch stage 22, in both embodiments of FIGS. 5b and 5c, is to hold the full voltage level for a binary "1" or "0" while both the other latch stages are transparent. The first and third stages are only both transparent for a period equal to $T_E$ or $T_c/2-T_E$, respectively. However, the quantization latency is $T_q=2(T_E)+T_c/2$ or $T_q=2(T_c/2)+T_E$, respectively, and where $T_E<<T_c/2$, the embodiment of FIG. 5b produces less quantization latency for better high frequency performance.

The Effect of Metastability on Continuous-Time Modulators

Because of the analog continuous-time, continuous-valued nature of the inputs to the comparators used in CT-DSMs, not all metastable states affect the SNR of CT-DSMs to the same extent. Metastable states of longer duration cause more degradation of the SNR. Thus, the extent of the SNR degradation of the signal output by a modulator is also affected by the waveform output by the comparator. As such, a more detailed analysis of comparator metastability would be useful to predict its effect on the SNR of CT-DSMs.

Figure 5F:
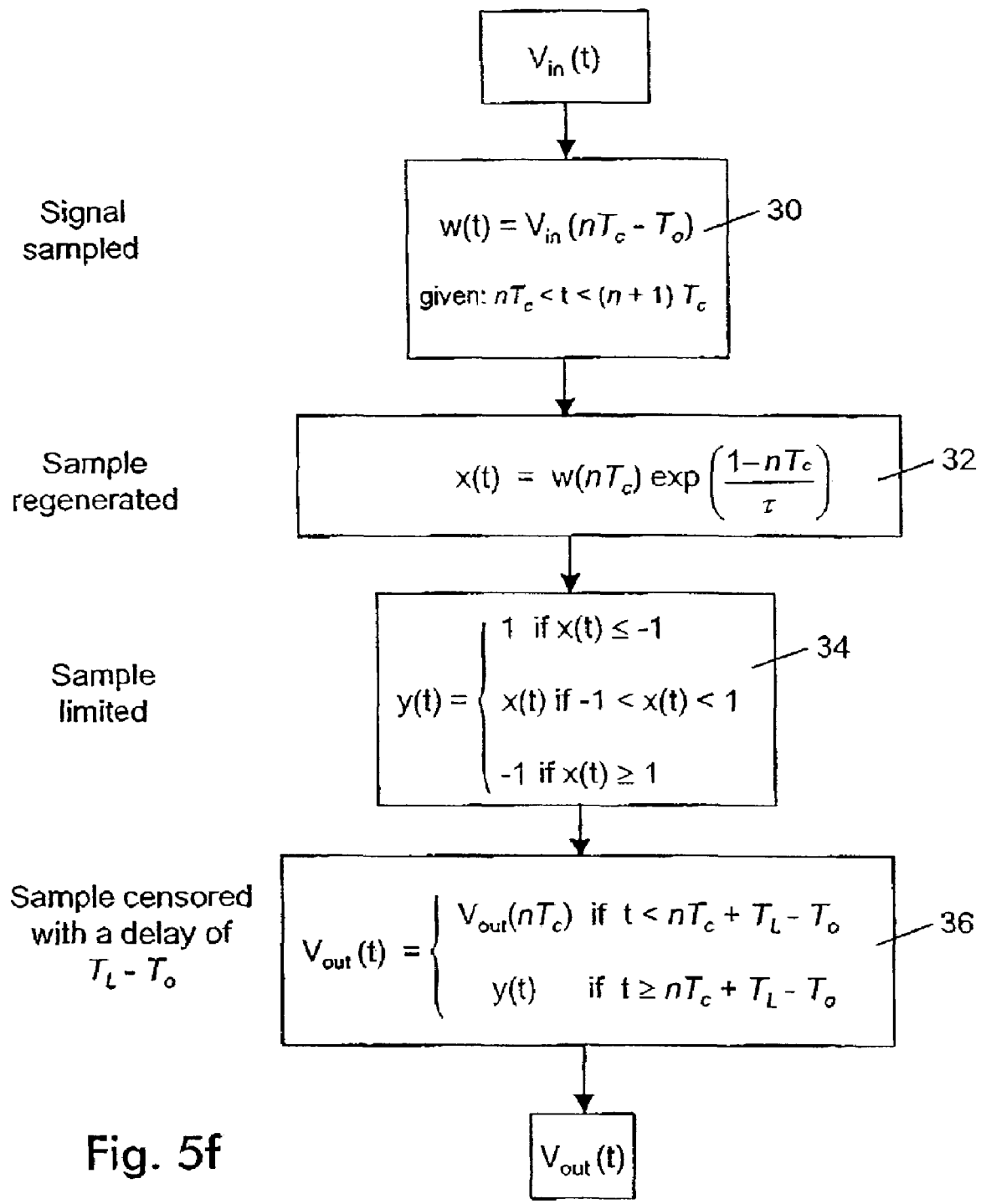
FIG. 5f is a flow diagram model of a three-latch continuous-time, continuous-valued comparator.

The four steps shown in FIG. 5f, model the over-all sampling, regenerating, limiting and censoring functions of the embodiment shown in FIG. 5d. In the first block 30, an ideal first latch stage samples the input voltage at a time $nT_c-T_o$ that is offset from the clock period by the sample offset interval $T_o$. The sampling instant $nT_c-T_o$ is defined as the time when the input signal most strongly correlates with the comparator output, and is determined statistically. Thus defined, the sampling instant may occur either before or after the beginning of the clock period $T_c$, depending on the device parameters in that critical first stage. The sampled value is then held constant over the remainder of the clock period until $(n+1)T_c$.

The second block 32 of FIG. 5f represents the exponential regeneration of the sampled signal by positive feedback by the cross-coupled pair within the first latch stage 20, as described above with reference to FIG. 5a. In the third block 34, regeneration terminates at the appropriate output voltage logic level (preferably 250 to 500 mV logic levels are implemented). The fourth block 36 represents the censoring function of the third latch stage 24 discussed above.

The continuous-time, continuous-valued comparator model shown in FIG. 5f can be used to determine the distribution of output voltages over time for a given distribution of input voltages using certain simplifying assumptions:

(1) Although $\tau$ actually increases as the magnitude of the output voltage $V_{out}$ of the first latch stage increases, as noted above, $\tau$ has been treated as constant during the entire regeneration period, from the sampling instant to the time when a valid logic level is obtained on the output.

(2) Several other significant effects that occur in actual comparators have also not been accounted for: hysteresis, high-frequency response roll-off, intersymbol interference, aperture jitter and thermal noise. However, the design considerations other than the small-signal assumptions used for evaluating $\tau$ do not affect of metastability analysis.

(3) For convenience in modeling, the censoring time $T_L-T_o$ has been set at a length of 15 $\tau$.

(4) The holding function of the second latch stage 22 is subsumed in the second and third blocks and, since the holding function of the second latch stage is transparently incorporated into this model, the fourth stage of the model is enabled on the clock cycle $T_c$ rather than $T_c/2$.

In normal CT-DSM operating conditions (no overload) the spectrum of the signal V(t) that is provided by the filter circuit 12 to the comparators 10 is filtered so that samples of V(t) represented therein are correlated, and $V(t_i)$ has an approximately Gaussian distribution:

$$P[V_{out}(t) | -1 < V_{out}(t) < +1 |] \approx \frac{1}{\sigma_{in}\exp\left(\frac{t-nT_c}{\tau}\right)\sqrt{2\pi}} \quad (8)$$

In the event that the limiter step 34 in the model shown in FIG. 5f is ineffective because neither limit value is attained: $-1<V_{out}(t)<+1$, then the input will have been amplified by at least a factor of $10^6$ and, with a censoring period length of 15 $\tau$, the output of the comparator will be proportional to the sampled input for a time (t) when $t \geq nT_c+T_L T_o$:

$$P[V_{out}(t) | -1 < V_{out}(t) < +1] = \quad (9)$$

$$\frac{1}{\sigma_{in}\exp\left(\frac{t-nT_c}{\tau}\right)\sqrt{2\pi}}\exp\left(-\left[\frac{V_{out}(t)}{\sigma_{in}\exp\left(\frac{t-nT_c}{\tau}\right)}\right]^2\right)$$

The non-limited, proportional output $V_{out}$ produced by (9) will have a Gaussian distribution with a larger variance than that produced by (8):

$$P[V_t(nT_c - T_o)] = \frac{1}{\sigma_{in}\sqrt{2\pi}}\exp\left(-\left[\frac{V_t(nT_c - T_o)}{\sigma_{in}}\right]^2\right) \quad (10)$$

The variance of the input signal, when scaled relative to the 250 to 500 mV digital swings typical of the output of these latches, is typically on the order of $10^{-2}<s_{in}<10^{-1}$. Since (10) applies only when $-1<V_{out}(t)<+1$, this results in:

$$\left[\frac{V_{out}(t)}{\sigma_{in}\exp\left(\frac{t-nT_c}{\tau}\right)}\right]^2 < 10^{-8}$$

apparently indicating a negligible dependence of $P[V_{out}(t)|-1<V_{out}(t)<+1|]$ on $V_{out}(t)$. Given approximately uniform probability density of $V_{out}(t)$ over the interval $-1<V_{out}(t)<+1$, therefore:

$$V_{out} = \exp\left(\frac{t-nT_c}{\tau}\right)V_t(nT_c - T_o) \quad (11)$$

As a description of the interval where metastability occurs $(-1<V_{out}(t)<+1)$, the relative difference between (10) and (11) is less the $10^{-8}$. In this open interval, $-1<V_{out}(t)<+1$, the output values for any two different cycles $V_{out}(t_1)$, $V_{out}(t_2)$ are approximately conditionally independent of the input level $V_{in}(t_i)$ provided by the signal V(t) the filter circuit 12. Most of the probability distribution of $V_{out}(t)$ is either $P[V_{out}(t)=+1]$ or $P[V_{out}(t)=-1]$ and is not independent of the input level $V_{ti}$ of $V_t$. Nonetheless, it is believed that equation #11 is a useful definition of latch behavior in the critical grey area $-1<V_{out}(t)<+1$ that approximates the metastability performance of the latch circuits in CT-DSMs.

Distribution of Output Trajectories in Simulations

Figure 7:
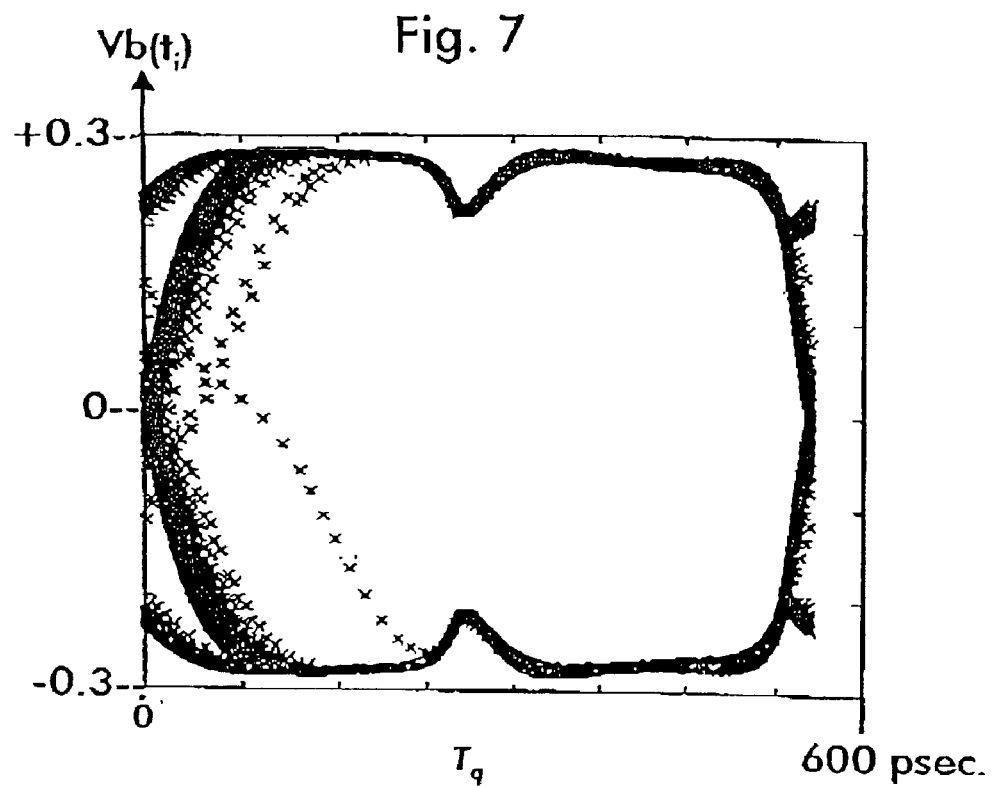
FIG. 7 is a distribution diagram showing the transient response performance of a comparator in accordance with the present invention in that SPICE delta-sigma modulator simulation.
Figure 6:
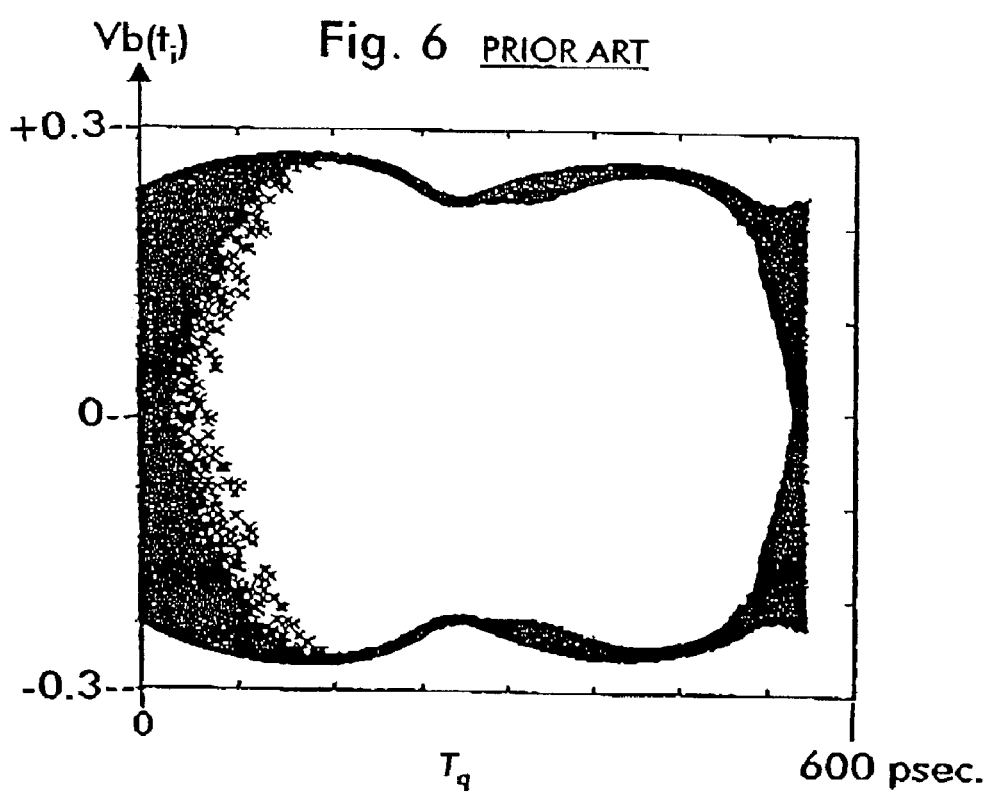
FIG. 6 is a distribution diagram showing the transient response performance of a prior art comparator in SPICE delta-sigma modulator simulation trials.

FIGS. 6 and 7 show the results of SPICE time-domain transient response simulations demonstrating the improvement in metastability performance represented by that model of metastability performance that is achieved by comparators in accordance with the present invention. In these simulations, over 13.5 k sampling cycles were carried out at a 1.35 Ghz clock rate. The input signal sampled was the sum of 219 MHz and 311 MHz sine waves, an input selected to provide a full range of the possible combinations of amplitude and slew rate.

The metastability errors produced by a conventional, two-stage comparator (n=2), shown in FIG. 6, resulted in an SNR that calculated out at less than 47 dB. However, if another latch stage were added to the comparator (n=3), the resulting conventional, three-stage comparator would then have a quantization latency $T_q$=550 picoseconds that limits the modulator to operating frequencies below $f_{max}$=5 MHz. In contrast, using comparators that provide improved quantization in accordance with the present invention, a modulator can be satisfactorily operated above $f_{max}$=5 Mhz, up to 2 GHz at a SNR>55 dB.

Specifically, in accordance with the embodiment shown in FIG. 5b, a delay time ($T_E$) selected such that $0<T_E<T_c/2$ is added to the clocks applied to the second and third stages in each comparator used in the delta-sigma modulator. The quantization latency $T_q$ and metastability error probability $P_{meta}$ for these comparators then become:

$$T_q = a + T_E + T_c(n-3)/2 \quad (12)$$

$$P_{meta} = b\,\exp(-c[a+T_E+T_c(n-3)/2]) \quad (13)$$

In the simulations, that delay time ($T_E$) of 110 picoseconds was added to the clock used in the simulation shown in FIG. 6, in accordance with the embodiment shown in FIG. 5b. The improved metastability performance thus produced, shown in FIG. 7, was obtained without the sacrifice of high frequency performance.

Transient Response Trajectories

In the transient response simulations shown in FIGS. 6 and 7, each output produced in response to an input sample is recorded as an individual "x" and those symbols collectively form "eye chart" scatter diagrams. The horizontal axis represents the time distribution of the outputs that were produced in response to the 13.5 k test samples sampled at times $t_i$, in relation to one quantization cycle time period. The vertical position of each output is determined by its respective voltage level $V_{out}(t_i)$. The trajectories formed within these scatter diagrams provide a qualitative comparison of the noise occurring in the two respective comparator outputs.

In FIG. 6 the measurements are clearly more widely dispersed, which indicates the occurrence of a large number of metastable states. In contrast, almost all the 13.5 k response trajectories in FIG. 7 are tightly packed into a single narrow band, showing very little signal dependence. Only three trajectories showing significant metastability are visible, trajectories that separate from the narrow bands of trajectories corresponding to the normal response of a quantizer to the variable sample level and slew rate of the input waveform. Since the quantization cycle at the 1.35 Ghz clock rate is shorter than that used in some applications, this is a strenuous test of metastability. Therefore the test results indicate that the present invention affords substantial improvement for a range of DSM applications.

Estimated DSM SNR Attributable to Metastability

The achievable signal-to-noise ratio for a DSM device is limited by several other inherent sources of noise in addition to metastability, including quantization noise, thermal noise, and clock jitter. However, for the sake of comparison, an estimate of the signal-to-noise ratio that a respective DSM device using a respective type of comparator delta-sigma modulator would achieve in the absence of error sources other than metastability was calculated.

Figure 1:
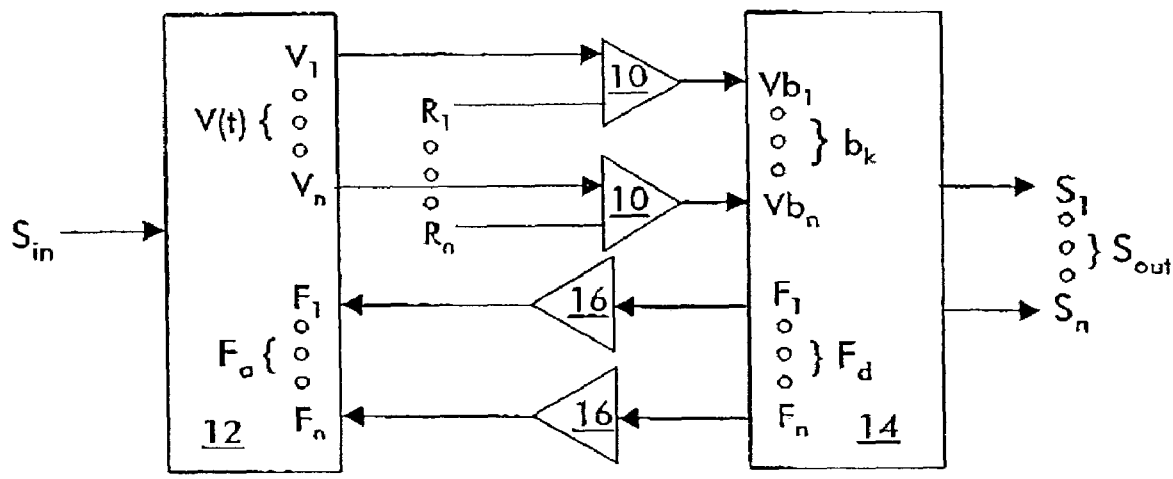
FIG. 1 is a single-line schematic diagram of a delta-sigma modulator in accordance with the prior art.
Figure 1A:
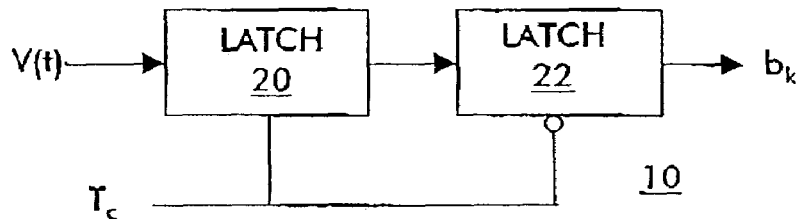
FIGS. 1a and 1b are schematic diagrams of conventional prior art two and three-stage comparators, respectively, for use in the modulator shown in FIG. 1.
Figure 1B:
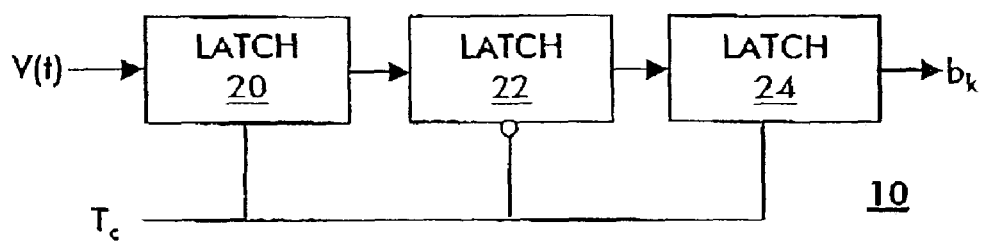
Figure 1C:
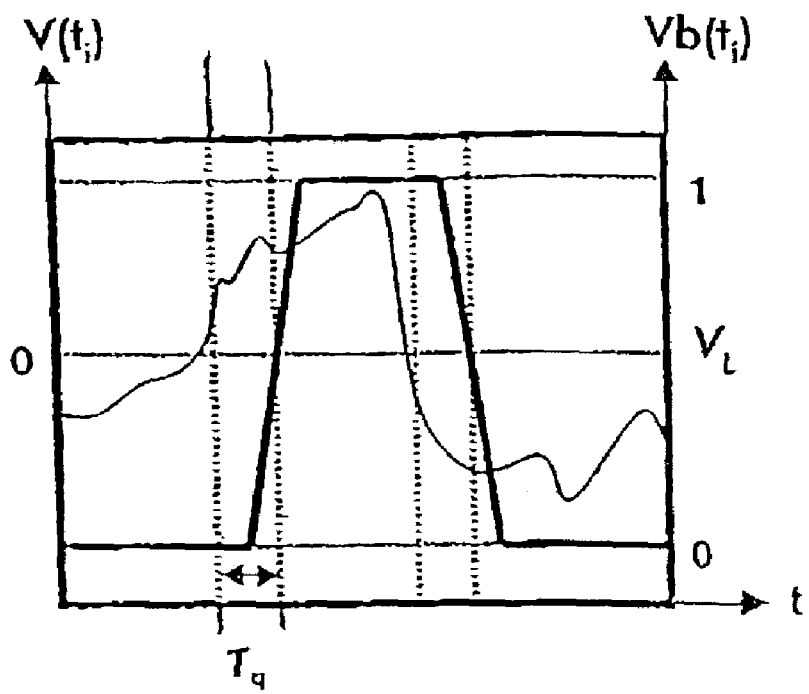
FIG. 1c is a schematic signal diagram for a conventional prior art comparator showing the quantization latency $T_q$.
Figure 2A:
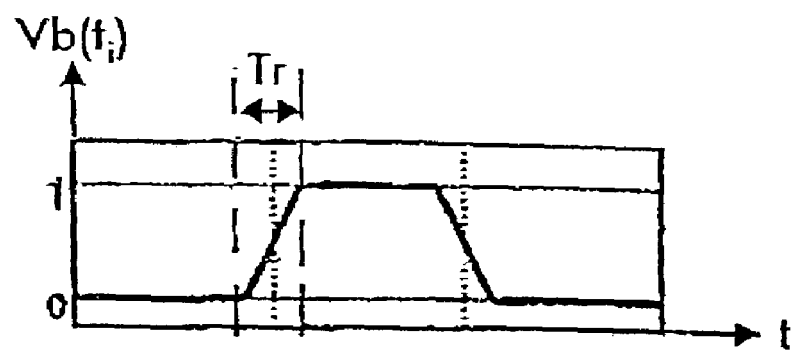
FIG. 2a is a schematic signal diagram showing the ideal response of the output of a comparator to the input signal shown in FIG. 1c.
Figure 2B:
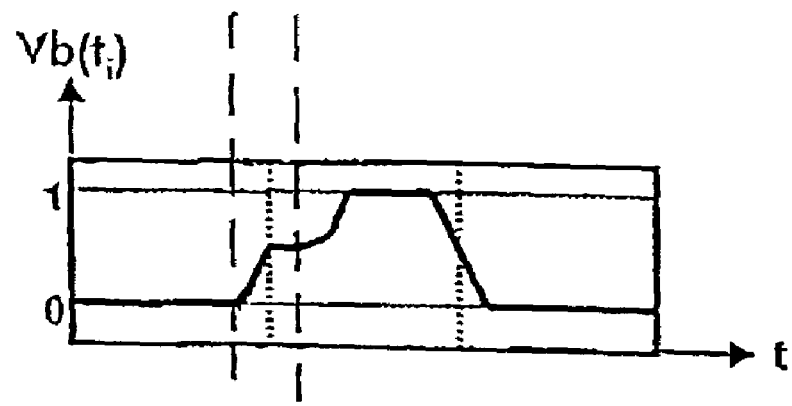
FIG. 2b is a schematic signal diagram showing a metastability error in the response of the output of a comparator to the input signal shown in FIG. 1c.

Ideally, each comparator 10 produces a binary output, which is one of two predetermined voltage levels with transitions between positive and negative polarity occurring only in predetermined time slots. This binary output is then converted by a digital to analog converter (DAC) into a charge that is injected back into the filter circuit 12. Ideal comparators would always provide full binary input levels to the DACs, such as the level seen in FIG. 2a. The full binary levels were −1.5 fC and +1.5 fC in this calculation. Distorted waveforms, produced by metastability errors in the comparators 10, such as the one seen in FIG. 2b, cause the DACs in the output interface circuit 14 to inject variable, that is, "non-binary" feedback charge values.

Where $V_T$ represents the thermal voltage (kT/q) and "tanh" indicates the hyperbolic tangent function the charge $I_{dac}$ produced by each DAC is $I_{dac}=\tanh(V_{out}/V_T)$ and the integral of the effective feedback charge $Q_i$ produced by the comparators in each cycle (i) can be defined as:

$$Q_i = \int \tanh(V_{out}(t)/V_T)dt \quad (14)$$

This indefinite integral approximates the feedback charge provided by a DAC "buffer" gain stage in the output interface circuits following the comparator 10 in a DSM.

Using this feedback charge value ($Q_i$) an estimated SNR can then be calculated from the mean and variance of the charge:

$$SNR = 10*\log_{10}[\text{mean}(Q_i)/\text{var}(Q_i)] \quad (15)$$

The estimated SNR contributed by metastability errors in the modulator simulation using a two-stage comparator is then 47 dB, and the estimated SNR produced in accordance with the present invention can be at a significantly improved 55 dB level in DSM devices that were the same except for the using comparator quantization in accordance with the present invention.

The invention has been described with reference to a presently preferred embodiment, but it will be apparent to one skilled in the art that variations and modifications are possible within the spirit and scope of the invention. As such, the invention is not to e limited to the disclosed embodiments except as required by the claims appended below.

What is claimed is:

1. A comparator having a signal input and a signal output, said comparator comprising:
   a first latch connected to the signal input, said first latch being adapted to be enabled to produce a first latch output signal in response to a signal on the signal input by a given clock signal having a given phase and a given cycle period $T_c$;
   delay means providing a delay $T_E$ such that $T_c/2 > T_E > 0$;
   a second latch connected to said first latch and adapted to be enabled to produce a second latch output signal in response to a second latch input signal produced using said first latch output signal by a first delayed clock signal having a first lag time $T_L$; and a third latch adapted to be enabled to supply a third latch signal to the signal output in response to said second latch output signal by a second delayed clock signal, said second delayed clock signal having a second lag time $T_S$, said second delayed clock signal being provided to the third latch in cooperation with the delay means, such that $T_S = T_c/2 + T_E$.

2. The comparator of claim 1 wherein first lag time $T_L = T_E$.

3. The comparator of claim 1 wherein first lag time $T_L = T_c/2$.

4. The comparator of claim 1 wherein the delay $T_E << T_c/2$.

5. A modulator having a modulator input for receiving a given signal and a modulator output, said modulator comprising:
   a filter circuit connected to the modulator input, said filter circuit producing a filtered signal on a filter circuit output in response to the given signal;
   an output interface circuit, said output interface circuit being adapted to supply a signal to the modulator output, said filter circuit being adapted to use a signal produced by said output interface circuit to produce said filtered signal;
   a comparator adapted to connect said filter circuit output to an input of said output interface circuit;
   a first latch in said comparator, said first latch being connected to said filter circuit output and adapted to be enabled to produce a first latch output signal in response to said filtered signal by a given clock signal having a given phase and a given cycle period $T_c$;
   delay means in said comparator for providing a delay $T_E$ such that $T_c/2 > T_E > 0$;
   a second latch in said comparator connected to said first latch and adapted to be enabled to produce a second latch output signal in response to a second latch input signal produced using said first latch output signal by a first delayed clock signal having a first lag time $T_L$; and
   a third latch in said comparator adapted to be enabled to supply a third latch signal to the modulator output in response to said second latch output signal by a second delayed clock signal, said second delayed clock signal being provided to the third latch in cooperation with the delay means, such that $T_S = T_c/2 + T_E$.

6. The modulator of claim 5 wherein first lag time $T_L = T_E$.

7. The modulator of claim 5 wherein first lag time $T_L = T_c/2$.

8. The modulator of claim 5 wherein the delay $T_E << T_c/2$.

9. The modulator of claim 5, further comprising:
   a plurality of said comparators adapted to connect said filter circuit output to respective inputs of said output interface circuit, said output interface circuit being adapted to supply a quantized signal to the modulator output in response to the signals provided by the comparators to said output interface circuit; and
   threshold means for determining a respective signal threshold beyond which each of said comparators provides an output in response to said filtered signal from said filter circuit, said threshold means providing a different threshold to each of said comparators.

10. The modulator of claim 9, further comprising:
    a respective digital to analog converter connected to the output of each of said comparators, each converter being adapted to supply a respective feedback signal to said filter circuit.

11. The modulator of claim 5, wherein said filter circuit comprises a bandpass filter.

12. The modulator of claim 5, wherein said modulator over-samples an analog voltage input signal having a predetermined bandwidth and spectrum, said modulator producing a quantized binary output signal in response to said over-sampled analog voltage signal, said quantized binary output signal having a spectrum that is a sum of the input signal's spectrum, said modulator being programmable to shape a spectrum of the quantization noise in said quantized binary output signal, wherein said filter circuit comprises a programmable digital filter having a passband and a stopband, said passband being programmable for said predetermined bandwidth of said analog voltage input signal and said stop band being tunable to reject quantization noise; and wherein said comparator is a decimator, said decimator subsampling said digitally filtered binary output signal to generate an n-bit digital signal having a predetermined sampling frequency.

13. A method of quantizing a given input signal, said method comprising the steps of:
    supplying the given input signal to a first latch;
    enabling the first latch to produce a first latch output signal in response to said given input signal by providing a given clock signal having a given phase and a given cycle period $T_c$;
    supplying the first latch output signal to a second latch;
    enabling the second latch to produce a second latch output signal in response to said first latch output signal by providing a first delayed clock signal having a first lag time $T_L$;
    supplying the second latch output signal to a third latch; and
    enabling said third latch to produce a third latch output signal in response to said second latch output signal by providing a delay $T_E$ so as to produce a second delayed clock signal having a second lag time $T_S$ such that $T_S = T_c/2 + T_E$.

14. The method of claim 13 further comprising the step of delaying the given clock signal to produce the first delayed clock signal so that $T_L = T_E$.

15. The method of claim 13 further comprising the step of inverting the given clock signal to produce the first delayed clock signal so that $T_L = T_c/2$.

16. The method of claim 13 wherein the delay $T_E << T_c/2$.

17. A method of producing a digital signal representing a given signal using a modulator having a filter circuit and an output interface, said method comprising the steps of:
    supplying a filtered signal produced in response to the given signal from the filter circuit to a first latch;
    enabling said first latch with a given clock signal having a given phase and a given clock cycle period $T_c$, so as to produce a first latch signal in response to the filtered signal;
    supplying a latch signal produced using the first latch signal to a second latch;
    enabling said second latch with a delayed clock signal to produce a second latch signal in response to said latch signal, said delayed clock signal having a lag time such that $T_L \neq nT_c/2$ and $T_L \neq 0$, where n is an integer; and
    supplying the second latch signal to the output interface, whereby transparency of the second latch stage to said first latch signal is reduced.

18. A comparator having a signal input and a signal output, said comparator comprising:
    a first latch connected to the signal input, said first latch being adapted to be enabled to produce a first latch output signal in response to a signal on the signal input by a given clock signal having a given phase and a given cycle period $T_c$;

a second latch connected to said first latch and adapted to be enabled to produce a second latch output signal in response to a second latch input signal produced using said first latch output signal by a first delayed clock signal having a first lag time $T_L$; and a third latch adapted to be enabled to supply a third latch signal to the signal output in response to said second latch output signal by a second delayed clock signal, said second delayed clock signal having a second lag time $T_S$, said second delayed clock signal being provided to the third latch and where $T_S=T_c/2$ $T_E$ and where $T_c/2>T_E>0$.

19. The comparator of claim 18 wherein first lag time $T_L=T_E$.

20. The comparator of claim 18 wherein first lag time $T_L=T_c/2$.

21. The comparator of claim 18 wherein the delay $T_E<<T_c/2$.

22. A modulator having a modulator input for receiving a given signal and a modulator output, said modulator comprising:

a filter circuit connected to the modulator input, said filter circuit producing a filtered signal on a filter circuit output in response to the given signal;

an output interface circuit, said output interface circuit being adapted to supply a signal to the modulator output, said filter circuit being adapted to use a signal produced by said output interface circuit to produce said filtered signal;

a comparator adapted to connect said filter circuit output to an input of said output interface circuit;

a first latch in said comparator, said first latch being connected to said filter circuit output and adapted to be enabled to produce a first latch output signal in response to said filtered signal by a given clock signal having a given phase and a given cycle period $T_c$;

a second latch in said comparator connected to said first latch and adapted to be enabled to produce a second latch output signal in response to a second latch input signal produced using said first latch output signal by a first delayed clock signal having a first lag time $T_L$; and a third latch in said comparator adapted to be enabled to supply a third latch signal to the modulator output in response to said second latch output signal by a second delayed clock signal, said second delayed clock signal being provided to the third latch, where $T_{S=Tc}/2+T_E$ [[$.T_c/2+T_E$]] and such that $T_c/2>T_E>0$.

23. The modulator of claim 22 wherein first lag time $T_L=T_E$.

24. The modulator of claim 22 wherein first lag time $T_L=T_c/2$ such that the first delayed clock signal is a logical complemented of the given clock signal.

25. The modulator of claim 22 wherein the delay $T_E<<T_c/2$.

26. The modulator of claim 22, further comprising:

a plurality of said comparators adapted to connect said filter circuit output to respective inputs of said output interface circuit, said output interface circuit being adapted to supply a quantized signal to the modulator output in response to the signals provided by the comparators to said output interface circuit; and threshold means for determining a respective signal threshold beyond which each of said comparators provides an output in response to said filtered signal from said filter circuit, said threshold means providing a different threshold to each of said comparators.

27. The modulator of claim 26, further comprising:

a respective digital to analog converter connected to the output of each of said comparators, each converter being adapted to supply a respective feedback signal to said filter circuit.

28. The modulator of claim 22, wherein said filter circuit comprises a bandpass filter.

29. The modulator of claim 22, wherein said modulator over-samples an analog voltage input signal having a predetermined bandwidth and spectrum, said modulator producing a quantized binary output signal in response to said over-sampled analog voltage signal, said quantized binary output signal having a spectrum that is a sum of the input signal's spectrum, said modulator being programmable to shape a spectrum of the quantization noise in said quantized binary output signal, wherein said filter circuit comprises a programmable digital filter having a passband and a stopband, said passband being programmable for said predetermined bandwidth of said analog voltage input signal and said stop band being tunable to reject quantization noise; and wherein said comparator is a decimator, said decimator subsampling said digitally filtered binary output signal to generate an n-bit digital signal having a predetermined sampling frequency.

* * * * *